US012477846B2

(12) United States Patent
Zang et al.

(10) Patent No.: US 12,477,846 B2
(45) Date of Patent: Nov. 18, 2025

(54) PIXEL WITH VERTICAL TRANSFER STRUCTURE FOR DARK CURRENT IMPROVEMENT, AN IMAGE SENSOR THEREOF AND A FABRICATION METHOD THEREOF

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 646 days.

(21) Appl. No.: 17/411,828

(22) Filed: Aug. 25, 2021

(65) Prior Publication Data
US 2023/0067685 A1  Mar. 2, 2023

(51) Int. Cl.
H10F 39/00    (2025.01)

(52) U.S. Cl.
CPC ..... H10F 39/80373 (2025.01); H10F 39/014 (2025.01); H10F 39/80377 (2025.01); *H10F 39/813* (2025.01)

(58) Field of Classification Search
CPC ......... H01L 27/14614; H01L 27/14616; H01L 27/14689; H10F 39/80373; H10F 39/80377; H10F 39/812; H10F 39/813
See application file for complete search history.

(56) References Cited

U.S. PATENT DOCUMENTS

| | | | |
|---|---|---|---|
| 10,084,005 B2* | 9/2018 | Oh | H01L 27/14603 |
| 2013/0175582 A1* | 7/2013 | Ihara | H01L 27/14647 |
| | | | 257/E27.15 |
| 2014/0252420 A1* | 9/2014 | Yi | H01L 27/1463 |
| | | | 257/229 |
| 2015/0243763 A1* | 8/2015 | Cheng | H01L 29/66636 |
| | | | 438/300 |
| 2016/0218138 A1* | 7/2016 | Oishi | H10F 39/812 |
| 2017/0358617 A1* | 12/2017 | Tekleab | H01L 27/14654 |
| 2021/0210534 A1* | 7/2021 | Chen | H10D 64/513 |

* cited by examiner

*Primary Examiner* — Anh D Mai
(74) *Attorney, Agent, or Firm* — COZEN O'CONNOR (57) ABSTRACT

A pixel of an image sensor includes a semiconductor substrate having a front surface and a back surface opposing the front surface, a photodiode and floating diffusion (FD) region formed in the substrate along a first pixel axis parallel to the front surface and a transfer gate formed in the front surface of the substrate between the photodiode and the FD region. The transfer gate includes a planar gate on the front surface of the substrate, a vertical transfer gate extending into the substrate from the planar gate, the vertical transfer gate further including a trench and a layer of doped semiconductor material epitaxially grown on the sides and bottom of the trench. The semiconductor substrate and the epitaxial layer comprise a first conductive type, and the photodiode and the FD region comprise a second conductive type. An image sensor and method of forming the vertical transfer gate are disclosed.

10 Claims, 6 Drawing Sheets

802
Implant impurities in a semiconductor substrate to form a photodiode.

804
Implant impurities in the semiconductor substrate to form a buried channel implant adjacent to the photodiode.

806
Pattern and etch one or more trenches in the semiconductor substrate having a width $W_T$.

> 820
> Deposit a buffer oxide layer on the semiconductor substrate.
>
> 822
> Deposit a hard mask on the buffer oxide layer.
>
> 824
> Deposit a patterned (location of trenches) photoresist layer on the hard mask.
>
> 826
> Etch the semiconductor substrate to form trenches.
>
> 828
> Remove the photoresist, hard mask and buffer oxide layers.

808
Epitaxially grow a doped semiconductor layer having a first conductive type in the trench.

810
Form a gate oxide layer on the semiconductor substrate and in the trench.

812
Deposit a gate electrode layer on the gate oxide layer and in the one or more trenches to form a transfer gate.

814
Form transfer gate spacer.

816
Implant impurities in the semiconductor substrate to form the floating diffusion region adjacent to the buried channel implant.

PIXEL WITH VERTICAL TRANSFER STRUCTURE FOR DARK CURRENT IMPROVEMENT, AN IMAGE SENSOR THEREOF AND A FABRICATION METHOD THEREOF

BACKGROUND

Wafer-level manufacturing using complementary metal-oxide semiconductor (CMOS) technology has enabled the incorporation of camera modules in many applications including automotive, security and mobile devices. The wide variety of applications means there is a continuous demand for both greater resolution and smaller size in image sensors. These demands often conflict.

Greater resolution is preferably achieved by increasing the number of pixels on a wafer while maintaining the overall image sensor at the same dimension or even smaller. The more pixels in the image sensor, the greater the resolution of an image captured by the image sensor. This can be accomplished both by reducing pixel size so that more pixels may be placed on the wafer or by reducing the space between pixels. Achieving a smaller size in an image sensor adds further restrictions on pixel size and spacing.

Each pixel in an image sensor includes several devices, for example, one or more photodiodes to capture incident light and convert it to electrons, and circuitry to transfer the electrons out of the photodiode so the amount of incident light can be digitized and further processed to capture an image represented by the incident light. These devices are formed in a semiconductor substrate. This type of image sensor is vulnerable to a few problems.

First, if the amount of light incident on a photodiode is greater than its capacity, surplus electrons can overflow into adjacent pixels before they can be transferred out, known as blooming. In addition, certain transfer structures are created by etching a trench into the semiconductor substrate. This creates damaged areas known as trap sites which give rise to dark current/white pixel. Addressing these issues create a design tradeoff wherein steps taken to reduce blooming can increase dark current, and steps taken to reduce dark current can increase blooming.

Blooming is addressed by creating a buried channel implant between the photodiode and a floating diffusion (FD) area so that excess electrons can overflow into the FD instead of adjacent pixels. The buried channel implant is formed by implanting impurities into the semiconductor substrate and has a conductive type the opposite of that of the semiconductor substrate.

One of the structures etched into the semiconductor substrate is a vertical transfer gate, which is used to transfer electrons out of a buried photodiode. Because the etching creates trap sites on the sides of the trench, passivation by implanting an impurity with a conductive type the same as the semiconductor substrate and the opposite of the buried channel implant. In some areas, the passivation implant coincides with the buried channel implant, leading to reduced function for both. Further, increasing the dosage for passivation implant to reduce dark current may degrade blooming performance.

SUMMARY OF THE EMBODIMENTS

In a first aspect, a pixel of an image sensor includes a semiconductor substrate having a front surface and a back surface opposing the front surface; a photodiode in the semiconductor substrate; a floating diffusion (FD) region formed in the semiconductor substrate and separated from the photodiode along a first pixel axis parallel to the front surface; and a transfer gate formed in the front surface of the semiconductor substrate to couple the photodiode to the FD region, the transfer gate including a planar gate on the front surface of the semiconductor substrate; a first vertical transfer gate extending a depth into the semiconductor substrate from the planar gate and located between the photodiode and the FD region along the first pixel axis, the first vertical transfer gate further including a first trench; and a layer of doped semiconductor material epitaxially grown on the sides and bottom of the first trench; wherein the semiconductor substrate and the epitaxial layer comprise a first conductive type, and the photodiode and the FD region comprise a second conductive type.

In a second aspect, an image sensor includes pixel with a vertical transfer gate.

In a third aspect, a method of forming a vertical transfer gate for a pixel in an image sensor includes an epitaxial growth process in the trench forming the vertical transfer gate.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s)

as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 9:
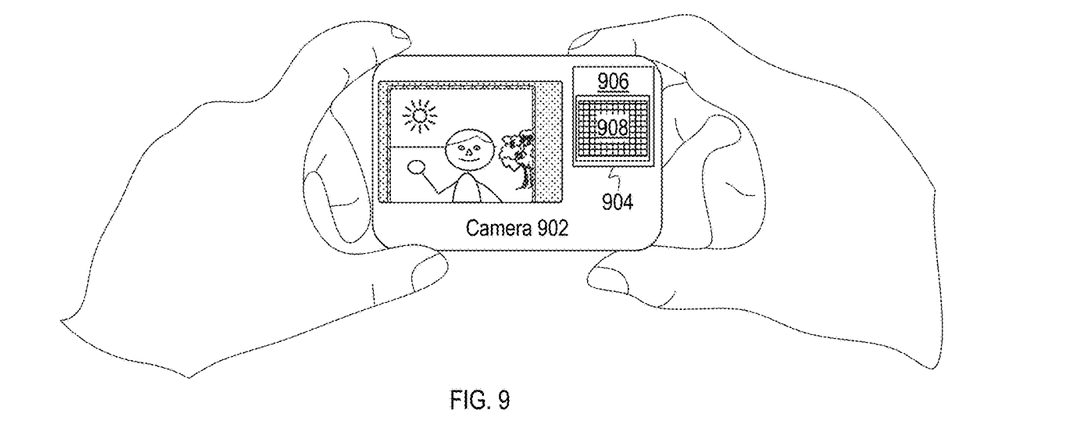
FIG. 9 depicts a camera imaging a scene.

FIG. 9 depicts a camera 902 imaging a scene. Camera 902 includes an image sensor 906, which includes a pixel-array substrate 904. Constituent elements of pixel-array substrate 904 may include at least one of silicon and germanium. Pixel-array substrate 904 includes a pixel array 908. Image sensor 906 may part of a chip-scale package or a chip-on-board package. Camera 902 is shown as a component of a handheld device, but it should be appreciated that other devices, such as security devices, automobile cameras, drone cameras, etc. may utilize camera 902 without departing from the scope hereof.

Figure 10:
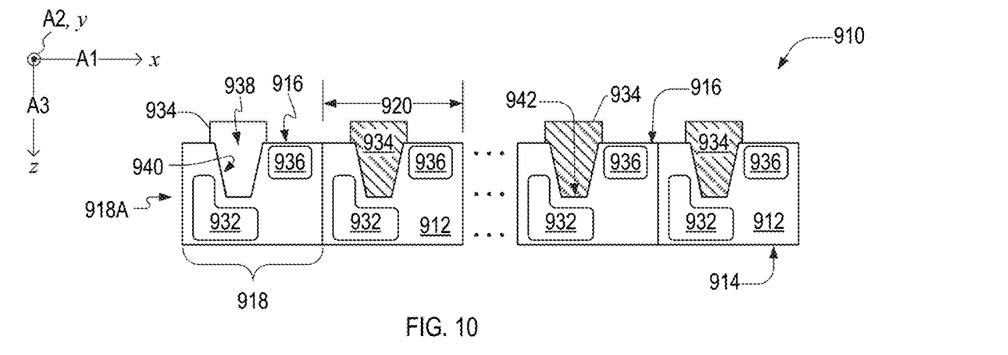
FIG. 10 is a cross-sectional schematic of a pixel-array substrate, which is an embodiment of a pixel-array substrate of the camera of FIG. 9.

FIG. 10 is a cross-sectional schematic of a pixel-array substrate 910, which is an example of pixel-array substrate 904 of image sensor 906. The cross-section illustrated in FIG. 10 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis, and a vertical direction is along the z axis.

Pixel-array substrate 910 includes a semiconductor substrate 912, which has a bottom substrate surface 914 and a front substrate surface 916, each of which may be perpendicular to direction A3. Herein, front substrate surface 916 may be referred to as the front side surface of semiconductor substrate 912 and bottom substrate surface 914 may be referred to as the backside surface of semiconductor substrate 912. Herein, front substrate surface 916 may be referred to as the non-illuminated surface of semiconductor substrate 912 and bottom substrate surface 914 opposite to front substrate surface 916 may be referred to as the illuminated surface of semiconductor substrate 912.

Semiconductor substrate 912 includes a plurality of pixels 918 that form a pixel array 918A, which is an example of pixel array 908. Pixels 918 are arranged in a plurality of rows and columns in directions A1 and A2 respectively. Pixel array 918A has a diagonal pixel pitch 920 in direction A1. In direction A2 pixel array 918A has pitch $P_y$ that, in embodiments, equals diagonal pixel pitch 920. Diagonal pixel pitch 920 in embodiments corresponding to a range of standard pixel pitch between 0.5 μm to 4.0 μm.

Figure 11:
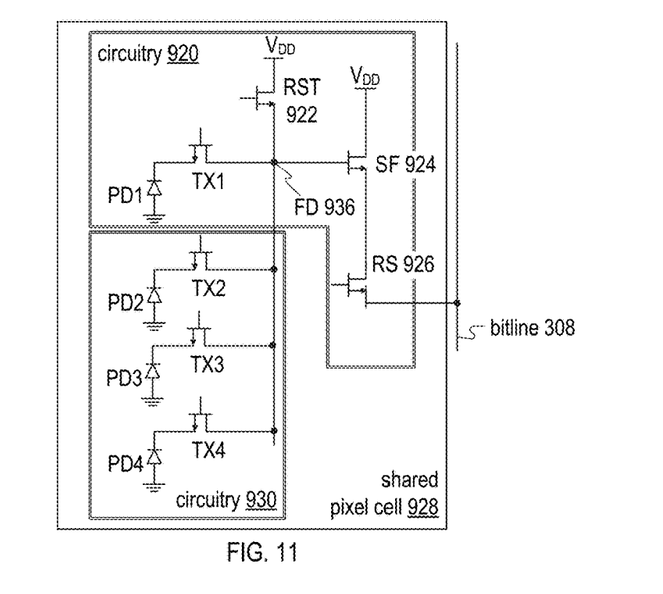
FIG. 11 is a circuit diagram of a shared pixel, which is a candidate pixel circuitry architecture of a pixel of FIG. 10.

FIG. 11 is a circuit diagram of a four-transistor ("4T") circuitry 920, which is a candidate pixel circuitry architecture of pixel 918. Circuitry 920 includes a photodiode PD1, a transfer transistor TX1, a reset transistor 922, a source-follower transistor 924, and a row-select transistor 926. Circuitry 920 is electrically connected to a bitline 308 of image sensor 906. FIGS. 10 and 11 are best viewed together in the following description.

In embodiments, each pixel 918 is one of multiple pixels of a shared pixel cell. FIG. 11 depicts a shared pixel-cell 928, which is candidate pixel circuitry architecture for the shared pixel cell. Shared pixel-cell 928 includes circuitry 920 and circuitry 930. Circuitry 930 includes additional respective photodiodes PD2-PD4 and transfer transistors TX2-TX4 of three additional pixels of the shared pixel-cell. Circuitry 930 and circuitry 920 represent pixel circuitry for a shared pixel-cell 928. Herein, transfer transistor TX refers to one of transfer transistors T1-T4.

Each pixel 918 includes a respective photodiode 932, a respective transfer transistor (e.g., transfer transistor TX) having vertical transfer gate 934, and a respective floating diffusion region 936.

Photodiode 932 of each pixel 918 is at least partially embedded in pixel-array substrate 910 and is configured to generate and accumulate charges in response to incident light (illumination) thereon, for example entered from bottom substrate surface 914 of semiconductor substrate 912 (e.g., backside surface of semiconductor substrate 912 or the illuminated side of semiconductor substrate 912) during an integration period of the image sensor 906. Photodiode 932 is an example of any one of photodiodes PD1-PD4 of FIG. 11. In embodiments, photodiode 932 and floating diffusion region 936 are a source and a drain, respectively, of transfer transistor TX.

Electrical connection of photodiode 932 to floating diffusion region 936 depends on voltage applied to a transfer gate (e.g., vertical transfer gate 934) of the respective transfer transistor (e.g., transfer transistor TX) associated with pixel 918. Charges, e.g., photoelectrons, photo-generated and accumulated in photodiode 932 of respective pixel 918 can be selectively transferred to floating diffusion region 936 depending on voltage applied to the transfer gate (e.g., vertical transfer gate 934) of the respective transfer transistor associated with pixel 918, for example during a subsequent charge transfer period. Photodiode 932 may be in various configurations including, but not limited to, a pinned photodiode configuration and a partially pinned photodiode configuration. In embodiments, a pinning layer (e.g., P-type doped layer) is disposed between front substrate surface 916 of semiconductor substrate 912 and photodiode region (e.g., N-typed doped region) of photodiode 932, wherein the pinning layer is coupled to a ground. In embodiments, charges accumulate in photodiode 932 during an integration or exposure period of image sensor 906.

A transfer gate (e.g., vertical transfer gate 934) of each transfer transistor (e.g., vertical gate electrode of transfer transistor TX1) is formed in a respective trench 938 defined by a side trench-surface 940 and a bottom trench-surface 942 of front substrate surface 916.

In embodiments, each pixel 918 is a pixel unit in a shared pixel cell and each pixel cell further includes reset transistor 922, source-follower transistor 924, and row-select transistor 926 shared by pixel 918 in the shared pixel cell. In FIG. 11, reset transistor 922, source-follower transistor 924, and row-select transistor 926 are abbreviated as RS 922, SF 924, and RST 926, respectively. Reset transistor 922 is coupled between a power line and floating diffusion region 936 to reset (e.g., discharge the residue charges in floating diffusion region 936 and charge floating diffusion region 936 to a preset voltage e.g., a supply voltage $V_{DD}$ or a reset voltage) under control of a reset signal during a reset period. Reset transistor 922 is further coupled to photodiode 932 (e.g., one of photodiodes PD1-PD4) through the respective transfer transistor TX (e.g., transfer transistor TX1-TX4) to reset respective photodiode 932 to the preset voltage during the reset period. Floating diffusion region 936 is coupled to a gate of source-follower transistor 924. Source-follower transistor 924 is coupled between the power line and row-select transistor 926. Source-follower transistor 924 operates to modulate an image signal based on the voltage of floating diffusion region 936, where the image signal corresponds to the amount photoelectrons accumulated in photodiode 932 of each pixel during the integration period at the gate thereof. Row-select transistor 926 selectively couples the output (e.g., image signal) of source-follower transistor 924 to the readout column line (for example, bitline 308) under control of a row select signal.

In operation, during the integration period (also referred to as an exposure or accumulation period) of image sensor 906, photodiode 932 detects or absorbs light incident on pixel 918 and photogenerates charge. During the integration period, each of the transfer transistors TX1-TX4 is turned off, i.e., vertical transfer gate 934 of the respective transfer transistor TX1-TX4 receives a cut-off signal (e.g., a negative biasing voltage). The photogenerated charge accumulated in photodiode 932 is indicative of the amount of light incident on photodiode 932. After the integration period, each of the transfer transistors TX1-TX4 is turned on forming a conduction channel along the vertical transfer gate structure and transfers the photogenerated charge from photodiode 932 to floating diffusion region 936 through the conduction channel upon reception of a transfer signal (e.g., a positive biasing voltage) at vertical transfer gate 934 of transfer transistors TX1-TX4. Source-follower transistor 924 generates the image signal. Row-select transistor 926 coupled to source-follower transistor 924 then selectively reads out the signal onto a column bit line 308 for subsequent image processing.

In embodiments, vertical transfer gate structures disclosed herein are part of a shared-type pixel cell where floating diffusion region 936 is shared by multiple photodiodes. Vertical transfer gate structures disclosed herein may apply to any of a variety of additional or alternative types of pixel cell, e.g. a four-transistor pixel cell, five-transistor pixel cell, or a six-transistor pixel cell.

Figure 1:
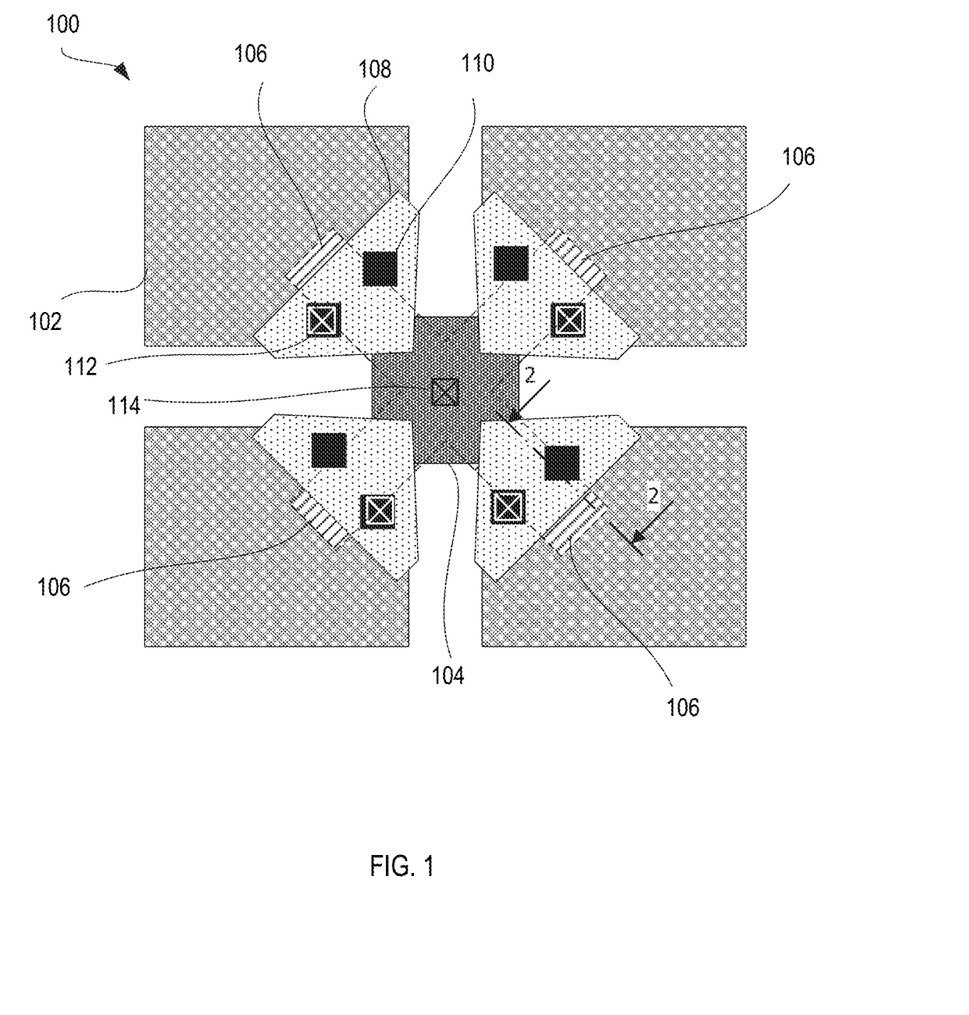
FIG. 1 is a plan view of a portion of an image sensor, in embodiments.

FIG. 1 is a plan view of a shared pixel cell 100 of an image sensor including four photodiodes 102 coupled to floating diffusion (FD) region 104 through respective transfer gates. Photodiodes 102 capture incident light, convert it into electrons and transfer the electrons to FD region 104. The shared pixel cell 100 includes a buried channel implant 106 that further couples photodiodes 102 to FD region 104 to provide a blooming path for excess electrons from individual photodiodes 102 to flow into FD region 104 during an integration period of shared pixel cell 100 when transfer gates are off instead of flowing into adjacent pixels or photodiodes, thereby improves blooming. Each of transfer gates in the shared pixel cell 100 includes planar gate 108 and two vertical transfer gates (VTGs) 110 and 112 extended from planar gate 108 on a semiconductor substrate into the semiconductor substrate having photodiodes and FD region 104 are formed therein. Planar gate 108 and vertical transfer gates (VTGs) 110 and 112 collectively are used to transfer electrons from each coupled photodiode 102 to FD region 104 during a readout of pixel 100 through electrical contact 114 and a metal interconnect layer (not illustrated). In embodiments, one of vertical transfer gates 110 and 112 includes an electrical contact as shown for VTG 112. FIG. 1 illustrates a shared pixel cell 100 with four photodiodes 102, however, principles disclosed herein also apply to shared pixel cells with a different number of photodiodes, such as two or one. Although structures are shown with geometric shapes, this is not limiting and other shapes are possible.

Figure 2:
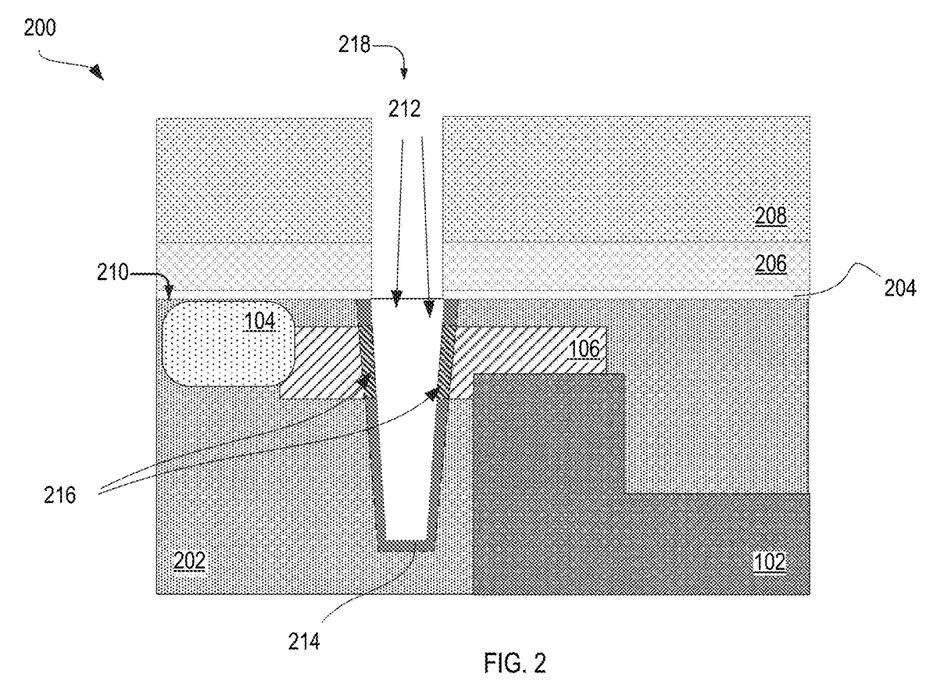
FIG. 2 is a cross-sectional view of a photodiode, a buried channel implant, and a vertical transfer gate, in embodiments.
Figure 3:
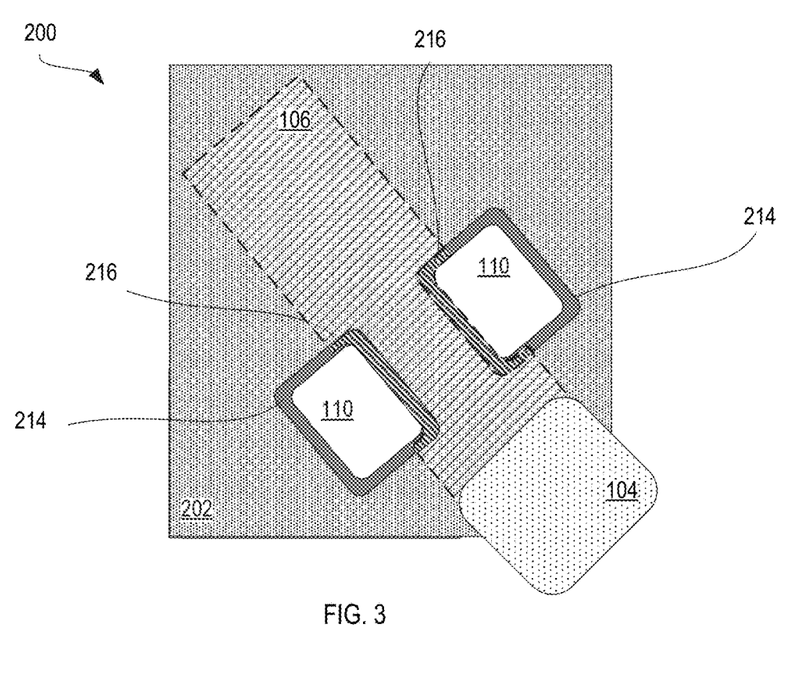
FIG. 3 is a schematic plan view of the photodiode of FIG. 2, in embodiments.

FIGS. 2 and 3 depict a pixel 200 with blooming control including a buried channel implant and dark current control and a vertical transfer gate (VTG). FIGS. 2 and 3 are best viewed together in the following description. In embodiments, a buried channel implant may also be referred to as a transfer enable implant.

FIG. 2 partial cross-sectional view of FIG. 2 taken at the sectioning plane and in the direction indicated by lines 2-2. FIG. 2 shows semiconductor substrate 202, which has a first conductive type, for example, a p-type like boron. Photodiode 102, FD region 104 and buried channel implant 106 are formed in semiconductor substrate 202 by implanting various concentrations of impurities that have a second conductive type opposite of the first conductive type, such as an n-type like arsenic and phosphorus. In embodiments, the polarities may be reversed, for example photodiode 102, FD region 104 and buried channel implant 106 may also be implanted with dopants of the first conductive type, while semiconductor substrate 202 is doped with dopants of the second conductive type. A buffer oxide layer 204 is deposited on front surface 210 of semiconductor substrate 202. In a first step of forming VTG 110, trench 218 is etched into front surface 210 of semiconductor substrate 202 using hard mask 206 and photoresist (PR) 208. After etching trench 218, implant ions 212 having the first conductive type e.g., p-type like boron, are implanted from front surface 210 of semiconductor substrate 202 into semiconductor substrate 202 to passivate the sidewalls and bottom surface of the etched trench 218 forming a passivation implant region 214. In regions 216, the passivation implant region 214 having the first conductive type is formed in the same area that the buried channel implant 106 implant having the second conductive type was formed. In other words, passivation implant region 214 and buried channel implant 106 in region 216 counter-doped each other.

Figure 4:
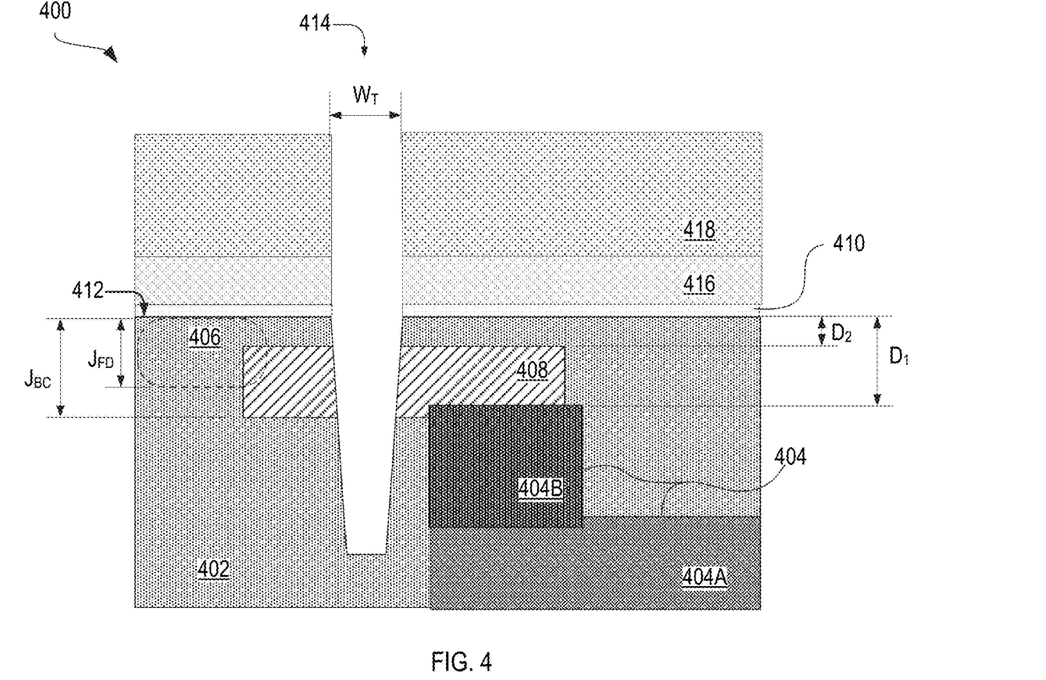
FIG. 4 depicts a cross-sectional view of a semiconductor substrate with a vertical transfer gate, in embodiments.
Figure 5:
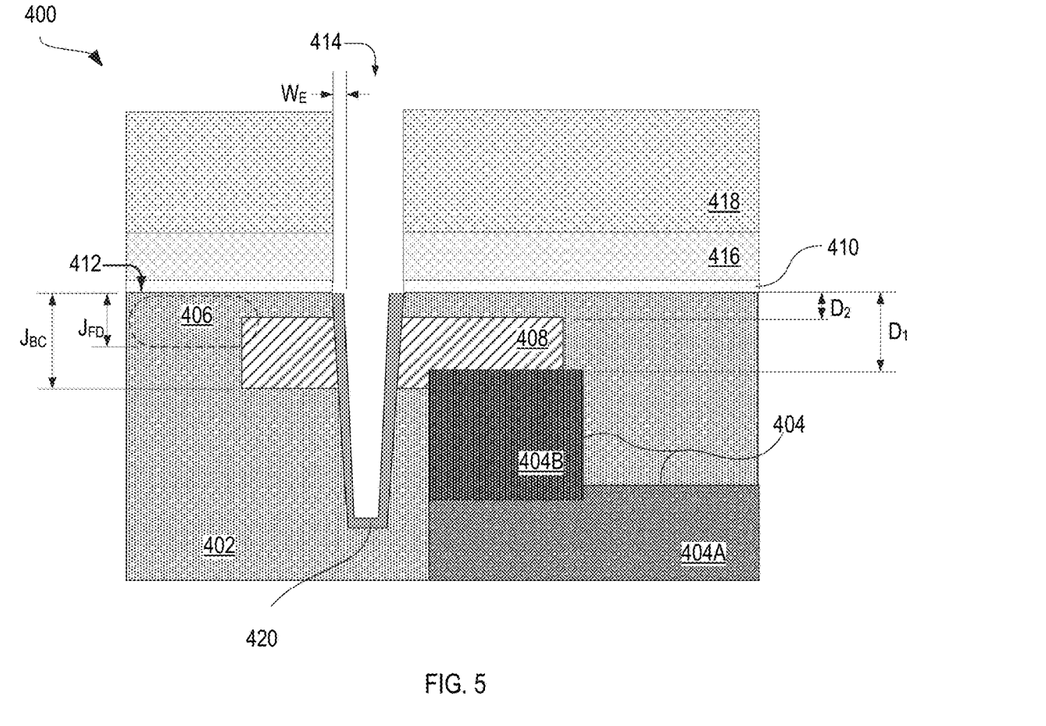
FIG. 5 depicts a cross-sectional view of the semiconductor substrate of FIG. 4 at a subsequent processing step, in embodiments.

FIG. 4 depicts a cross-sectional view of a pixel cell 400 with a photodiode, a buried channel implant, an FD region and a vertical transfer gate (VTG) formed in a semiconductor substrate 402, in embodiments. FIG. 5 depicts semiconductor substrate 402 at a subsequent processing step. FIGS. 4 and 5 are best viewed together in the following description. In embodiments, a buried channel implant may also be referred to as a transfer enabled implant.

FIG. 4 shows a semi-fabricated semiconductor substrate 402, which has a first conductive type, for example, a p-type such as boron. In an embodiment, semiconductor substrate 402 is formed of silicon, although other semiconductor materials may be used, for example, bulk silicon substrates, doped silicon substrates, silicon on insulator (SOI) substrate, silicon-germanium, etc. In embodiments, photodiode 404 includes a top photodiode section 404B and a bottom photodiode section 404A. Top photodiode section 404B is arranged to extend toward and adjoin the bottom photodiode section 404A. In some embodiments, the doping concentration of top photodiode section 404B is greater than the bottom photodiode section 404A.

Photodiode 404, FD region 406 and buried channel implant 408 are doped regions formed in semiconductor substrate 402 by implanting various concentrations of dopants that have a second conductive type opposite of the first conductive type, such as an n-type into front surface 412 of semiconductor substrate 402. In embodiments, the polarity can be reversed, photodiode sections 404A, 404B, FD region 406 and buried channel implant 408 may also be implanted with dopants of first conductive type (e.g., p-type), and semiconductor substrate 402 is a silicon substrate doped with dopants of second conductive type (e.g., n-type).

In some embodiments, photodiode 404 may be an example of photodiodes 102 in a shared pixel cell, the buried channel implant 408 may be an example of buried channel implant 106 and FD region 406 may be an example of FD region 104. In embodiments, FD region 406 may implanted after the formation of vertical transfer gate, and is shown in FIG. 4 for structural illustration of pixel cell 400. In some embodiments, the concentration of buried channel implant 408 is configured to be lower than the concentration of FD region 406 to provide a blooming path for excess charges to flow from photodiode 404 to FD region 406. In some embodiments, the concentration of buried channel implant 406 is configured to be at least the same as that of the photodiode 404.

In embodiments, photodiode 404 (e.g., top photodiode section 404B) is formed or implanted at a first depth $D_1$ in semiconductor substrate 402 and FD region 406 is formed in semiconductor substrate 402 proximate to front surface 412 and has a junction depth JFD. The first depth $D_1$ of the photodiode 404 is greater than the junction depth JFD of FD region 406 with respective to front surface 412 of semiconductor substrate 402. The buried channel implant 408 is formed at a second depth D2 beneath front surface 412 in the semiconductor substrate 402. The buried channel implant 408 extends depthwise to a junction depth JBC and in contact with the photodiode 404. The second depth D2 is less or shallower than the first depth $D_1$ of photodiode 404 with respect to front surface 412 of the semiconductor substrate 402. The buried channel implant 408 is implanted extending between the FD region 406 and photodiode 404 such that i) a portion of the buried channel implant 408 proximate to the FD region 406 overlaps with the FD region 406 and a portion of the buried channel implant 408 proximate to the photodiode 404 overlaps with top photodiode section 404B of the photodiode 404 or ii) at least part of the depletion region associated with buried channel implant 408 proximate to the FD region 406 overlaps with the depletion region associated with FD region 406 and a portion of the buried channel implant 408 proximate to the photodiode 404 overlaps with top photodiode section portion 404B of the photodiode 404. The buried channel implant 408 couples the photodiode 404 to the FD region 406. In some embodiments, the junction depth JBC of the buried channel implant 408 is the same as the junction depth JFD of FD region 406. In some embodiments, the junction depth JBC of the buried channel implant 408 is greater or deeper than the junction depth JFD of FD region 406. In embodiments, a buffer oxide layer 410 is on front surface 412 of semiconductor substrate 402, and between the hard mask 416 and front surface 412 of semiconductor substrate 402.

Trench 414 is patterned and etched through hard mask 416 and photoresist (PR) 418 and into front surface 412 of semiconductor substrate 402 by a process of isotropic dry etching, for example, plasma etching. In embodiments, isotropic dry etching parameters depend on the material of semiconductor substrate 402 and include pressure, gas composition (e.g., oxygen $O_2$, fluorine, $SF_6$, $CF_4$, $CHF_3$, $C_4F_8$), gas generation or injection method, and generator power. When removing material from trench 414, the etching process leaves silicon (Si) dangling bonds on the sidewalls and bottom of the trench 414. The trench 414 is formed adjacent to photodiode 404 and buried channel implant 408 in semiconductor substrate 402. In embodiments, trench 414 is in contact with buried channel implant 408. In the illustrated embodiment, the trench 414 has a trench depth greater than the junction depth JBC of the buried channel implant 408 with respect to front surface 412 of semiconductor substrate 402. In some embodiments, trench 414 intersects the doped region of the buried channel implant 408.

In embodiments, trench 414 is etched to have a width WT of approximately 120-150 nm. Although a particular trench profile extending into semiconductor substrate 402 is shown in FIGS. 4 and 5, this is not limiting and trench 414 could have a variety of sidewall shapes, angles and depths as needed for a particular image sensor. After etching, trench 414 may be subjected to surface treatment processes to remove some Si defects and reduce humidity at the trench surface, for example, Siconi™ and hydrogen bake. Siconi is a soft dry chemical etching process (e.g. plasma) that may selectively remove oxidized silicon surface defects by exposing the region to be etched to etching agents such as $H_2$, $HF_3$ and $NH_3$. Hydrogen bake is the subsequent surface clearing process used to remove oxide present on the silicon interface. These processes smooth the etched trench surfaces of trench 414 and improve dark current.

As shown in FIG. 5, layer 420 is epitaxially grown on the sides and bottom of trench 414. In embodiments, layer 420 is silicon (Si) that is in-site doped with boron (B), although a variety of dopants having the first conductive type may be used. In embodiments, parameters of an epitaxial growth process such as length of time, growth rate and temperature are chosen to grow substrate material on the bottom and sides inside trench 414 to a width $W_E$ such that $W_E$ is approximately 5-30 nm. Epitaxy is a process of forming new layers on a substrate (e.g., semiconductor substrate 402) that have a crystalline structure aligned with that of the substrate (e.g., semiconductor substrate 402) as opposed to other techniques that result in a random crystal orientation. In embodiments, a vapor-phase epitaxial growth process using, for example, $BH_3$ (borane) and $SiH_4$ (silane), is performed at a temperature of approximately 700 to 750° C. Although a representative example is given, any suitable epitaxial growth process may be used. In some embodiment, the epitaxially grown layer 420 is formed of same material and same lattice structure as the semiconductor substrate 402. In some embodiments, the epitaxially grown layer 420 is single crystal silicon material layer.

Figure 6:
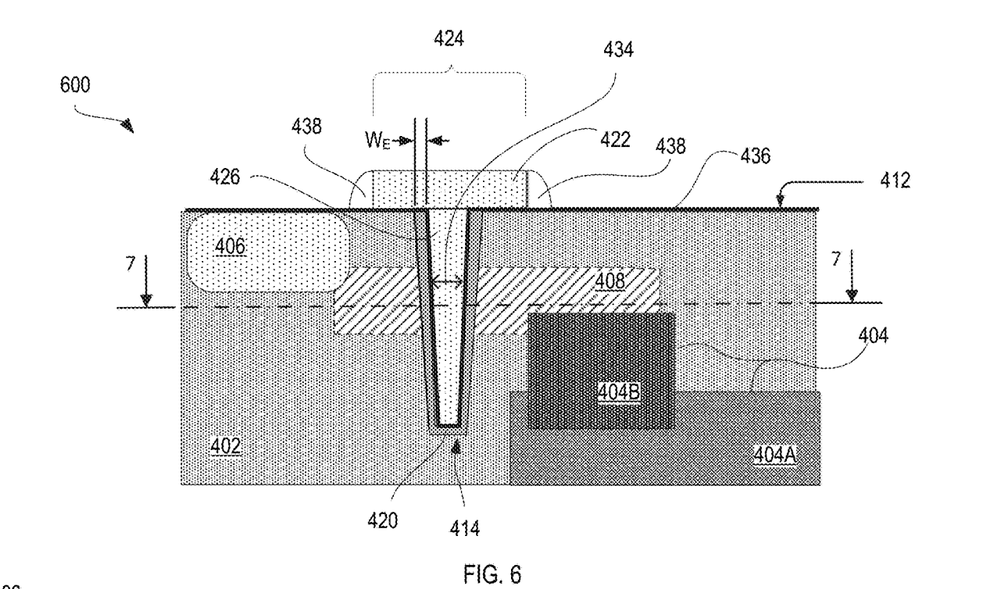
FIG. 6 is a cross-sectional view of a pixel with a vertical transfer gate, in embodiments.
Figure 7:
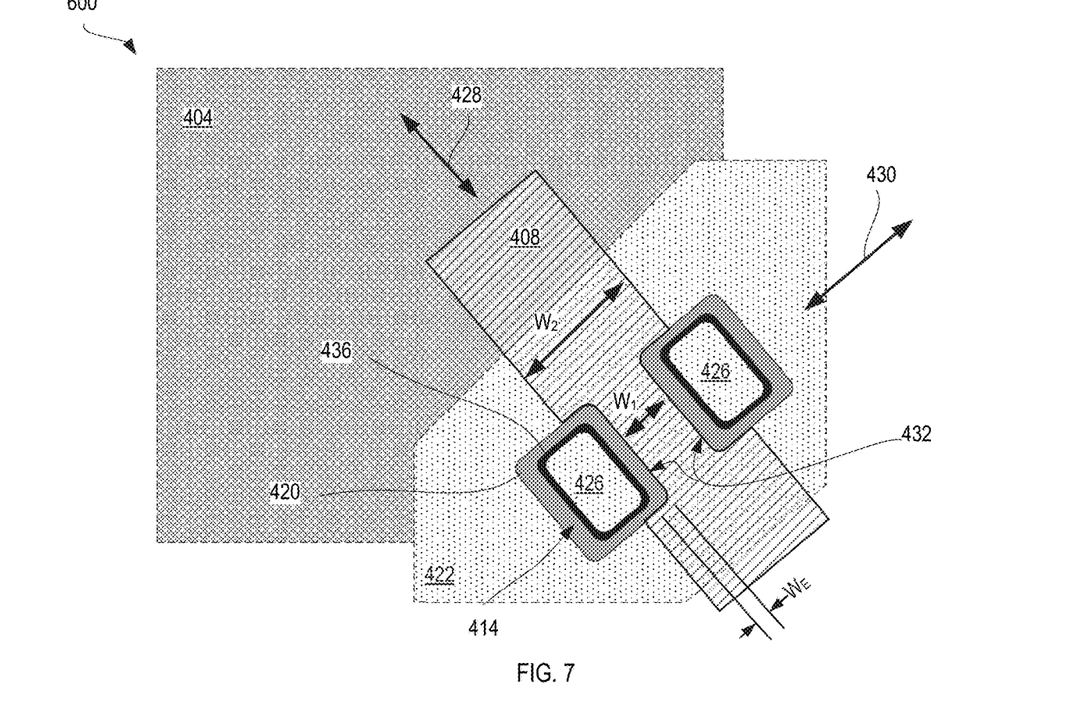
FIG. 7 is a partial plan view of the pixel of FIG. 6 taken at the sectioning plane and in the direction indicated by lines 7-7, in embodiments.

FIG. 6 is a cross-sectional view of a pixel 600 with a vertical transfer gate, in embodiments. FIG. 7 is a partial plan cross-sectional view of FIG. 6 taken at the sectioning plane and in the direction indicated by lines 7-7, in embodiments. FIGS. 6 and 7 are best viewed together in the following description. Common reference numbers indicate common elements from FIGS. 4 and 5.

FIG. 6 shows pixel 600 with semiconductor substrate 402, which has a first conductive type, for example, a p-type. Semiconductor substrate 402 illustrated in FIG. 6 is a semi-fabricated substrate after the removal of photoresist 418, hardmask 416, and buffer oxide layer 410 of FIGS. 4 and 5. Photodiode 404, FD region 406 and buried channel 408 are formed in semiconductor substrate 402 by implanting various concentrations of impurities that have a second conductive type opposite of the first conductive type, such as an n-type. In embodiments, photodiode 102, FD region 104 and buried channel 106 may also be implanted with different types of impurities, such as boron. Trench 414 is etched into the front surface of semiconductor substrate 402 and layer 420 is epitaxially grown on the sidewalls and bottom of trench 414 as discussed above with respect to FIGS. 4 and 5. In embodiments, layer 420 is doped semiconductor material having a doping concentration of approximately $1E16$-$1E18$ $cm^{-3}$ of a dopant having the first conductive type, similar to the first conductive type of semiconductor substrate 402 but with greater dopant concertation than the semiconductor substrate 402. In embodiments, the layer 420 has a dopant concentration greater than the buried channel implant 408, wherein the buried channel implant 408 may have a dopant concentration of approximately $1E16$-$1E18$ $cm^{-3}$. The width $W_E$ of layer 420 is approximately 5-30 nm. In some embodiments, the in-situ doped concentration of layer 420 is configured based on the dopant concentration of buried channel implant 408. Although a particular profile of layer 420 is shown in the drawings, this is for purposes of illustration only. For example, the thickness of layer 420 on the bottom of trench 414 may be greater than its width on the sidewalls of trench 414.

Gate oxide layer 436 is deposited on front surface 412 of semiconductor substrate 402 and on the sidewalls and bottom of layer 420 in trench 414, for example after grown layer 420 on the sidewalls and bottom of trench 414. The doped portion of buried channel implant 408 in the semiconductor substrate 402 and the gate oxide layer 436 are separated by the grown layer 420. Hence, the buried channel implant 408 in the illustrated embodiment is spaced away from a silicon-oxide interface in contrast to pixel 200, and further reduces dark current noises.

Polysilicon or a similar material is deposited on the front surface 412 of semiconductor substrate 402 and in trench 414 to form a transfer gate 424. Transfer gate 424 includes a planar gate 422 on the front surface of semiconductor substrate 402 and one or more vertical transfer gates 426. Planar gate 422 may have a shape similar to planar gate 108 of FIG. 1. In embodiments, transfer gate spacers 438 may be formed surrounding sidewalls of planar gate 422 on front surface 412 of semiconductor substrate 402. In some embodiments, transfer gate spacers 438 are formed on sidewalls of planar gate 422 on gate oxide layer 436. Transfer gate spacers protect the sidewalls of transfer gate 424 and separate gates from the source and drain regions of transfer gate 424. Transfer gate spacers 438 may be formed from a dielectric such as silicon oxide or silicon nitride and formed in a single or multi-dielectric layers. Transfer gate 424 may include one vertical transfer gate 426 or a plurality of vertical transfer gates 426 as shown in FIG. 7.

Two vertical transfer gates 426 of pixel 600 are shown in FIG. 7 similarly to the vertical transfer gates 110, 112 of FIG. 1. Planar gate 422 and photodiode 404 are shown in outline for reference. Photodiode 404 represents photodiode sections 404A and 404B as discussed herein. Buried channel implant 408 extends between photodiode 404 and FD region 406 (not shown) along a first pixel axis 428. A second pixel axis 430 is perpendicular to first pixel axis 428.

In embodiments, buried channel implant 408 is formed in between the first and second vertical transfer gates 426. The first and second vertical transfer gates 426 extends from the planar gate 422 and intersects the buried channel implant 408 in a vertical direction plane perpendicular to first pixel axis 428 and second pixel axis 430. Buried channel implant 408 has a first width $W_1$ between the first and second vertical transfer gates 426 along the first pixel axis 428 and parallel to second pixel axis 430. Buried channel implant 408 has a second width $W_2$ at other locations along the first pixel axis 428 such that $W_2 > W_1$. First width $W_1$ extends between inner edges 432 of layer 420 so that width $W_E$ of layer 420 provides a buffer between buried channel implant 408 and vertical transfer gates 426.

As explained above, layer 420 and semiconductor substrate 402 have a first conductive type (e.g., p-type) while buried channel implant 408 has a second conductive type (e.g., n-type) opposite to the first conductive type. Layer 420 moves or shifts the interface boundary between buried channel implant 408 and gate oxide layer 436 of VTGs 426 reduces dark current associated with defects on silicon-oxide interface. Further, with the layer 420 being epitaxially grown in trenches for VTGs 426, the counter-doping effect between layer 402 and buried channel implant 408 is reduced, provide for a much more relaxed design window between layer 402 and buried channel implant 408. For example, a doping concentration of layer 402 having the first conductive type in VTGs 426 can be increased for passivation needs without degrading blooming performance.

Layer 420 also reduces the effective gate length 434 of VTGs 426 along the first pixel axis 428. A reduced gate length takes advantage of the short-channel effect to induce leakage and improve blooming. The short-channel effect occurs in MOSFETS (metal-oxide-semiconductor field-effect transistor) where the channel length is comparable to the depletion layer widths of the source and drain junctions of the transistor. The short-channel effect makes it easier for electrons generated by photodiode 404 that are exceeding the full well capacity of photodiode 404 e.g., excess electrons to move through buried channel 408 when transfer gate 424 is off instead of neighboring pixels, thus improving the blooming performance of the pixel.

Figure 8:
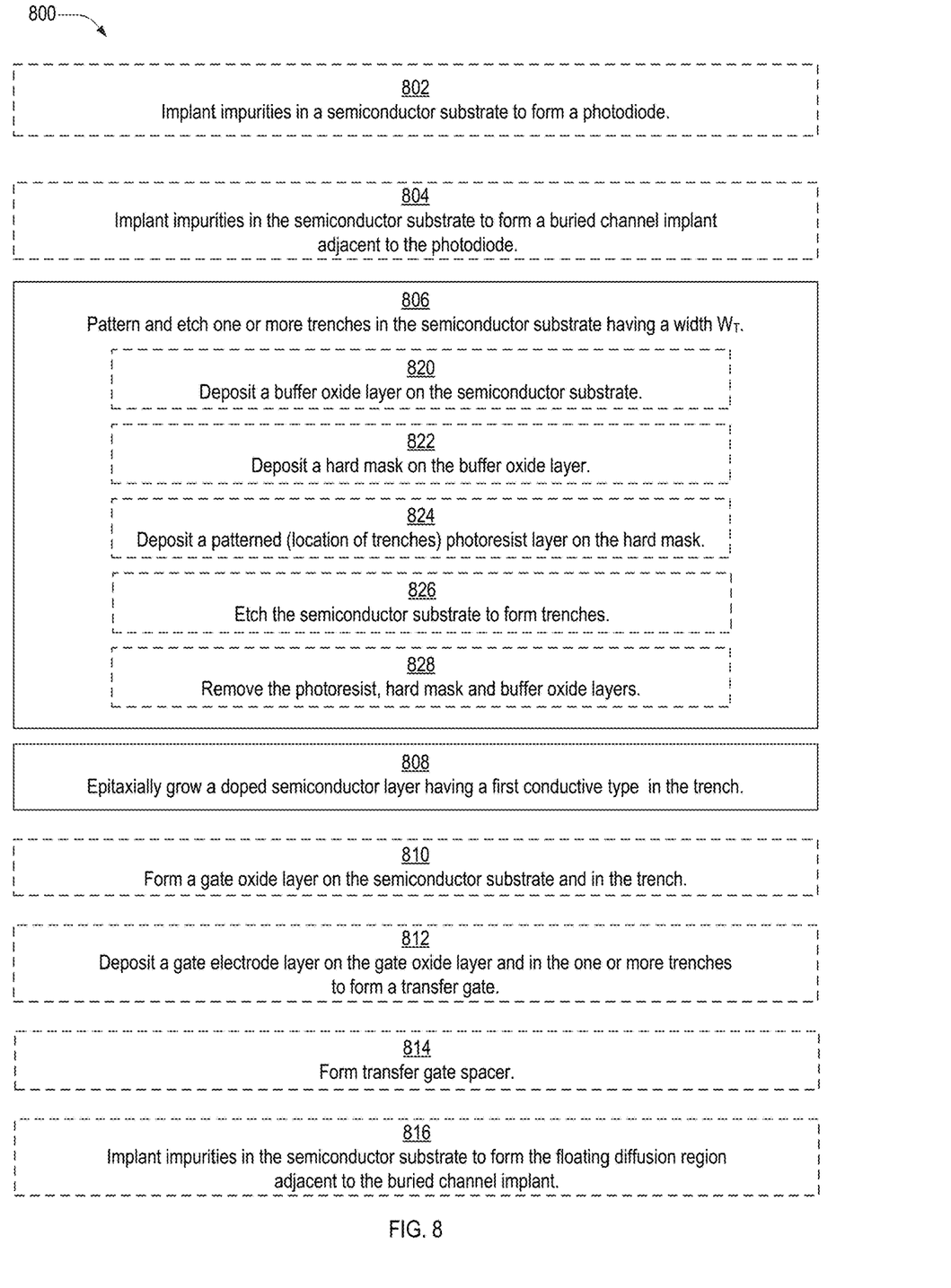
FIG. 8 is a flowchart illustrating a method for fabricating a pixel with a vertical transfer gate, in embodiments.

FIG. 8 is a flowchart illustrating a method 800 for fabricating a pixel with a vertical transfer gate, in embodiments. Method 800 includes steps 806 and 808. In embodiments, method 800 also includes at least one of steps 802, 804, 810-816. In some embodiments, method 800 includes steps 820-828.

Step 802 includes implanting impurities in a semiconductor substrate has a first conductive type (e.g., p-type dopant). In an example of step 802, impurities having a second conductive type opposite to first conductive type (e.g., n-type dopant such as arsenic, phosphorus) are implanted in semiconductor substrate 402 to form photodiode 404 for a pixel in an image sensor by implantation with various implantation energies.

Step 804 includes implanting impurities in a semiconductor substrate to form a buried channel implant. In an example of step 804, impurities having the second conductive type as photodiode 404 are implanted in semiconductor substrate 402 to form buried channel implant 408 for a pixel 400 in an image sensor by implantation with various implantation energies. In some embodiments, the dopant concentration of the buried channel implant 408 approximately 1E16-18 cm$^{-3}$.

Step 806 includes patterning and etching one or more trenches in the semiconductor substrate. In an example of step 806, one or more trenches 414 are etched from the front surface of semiconductor substrate 402 to a width of WT. In embodiments, WT is larger than an intended critical dimension (CD) of a vertical transfer gate for the image sensor. Etching a wider trench allows image sensors to be designed for a smaller VTG structure because due to processing limitation e.g., lithography limitation, etching a small VTG trench CD may have rougher sidewall surface resulting higher dark current and white pixel problems. This makes the design tradeoffs to minimize blooming and minimize dark current even more difficult.

To illustrate principles described herein, sub-steps 820-828 of step 806 will be described, however, other processes may be used to pattern and etch trenches 414. In step 820, buffer oxide layer 410 is blankly deposited on substrate surface 412. In step 822, hard mask 416 is deposited on buffer oxide layer 410. In step 824, photoresist 418 is deposited on hard mask 416, then patterned with the locations of trenches 414. In step 826, semiconductor substrate 402 is etched to form trenches 414. In step 828, photoresist 418, hard mask 416 and buffer oxide layer 410 are removed.

Step 808 includes epitaxially growing a doped semiconductor layer in the one or more trenches. In an example of step 808, layer 420 is in-situ doped epitaxially grown in one or more trenches 414 and layer 420 is in-situ doped with impurities having the first conductive type. The dopant concentration of layer 420 is approximately 1E16-1E18 cm$^{-3}$. In embodiments, parameters of an epitaxial growth process such as length of time, growth rate and temperature are chosen to grow substrate material on the bottom and sides inside trench 414 to a width $W_E$ such that $W_E$ is approximately 5-30 nm. Epitaxy is a process of forming new layers on a substrate that have a crystalline structure aligned with that of the substrate as opposed to other techniques that result in a random crystal orientation. In embodiments, a vapor-phase epitaxial growth process using, for example, BH$_3$ (borane) and SiH$_4$ (silane), is performed at a temperature of approximately 500-650° C. Although a representative example is given, any suitable epitaxial growth process may be used.

Step 810 incudes forming a gate oxide layer on layer in the trench, for example by deposition process or thermal oxidation process. In an example of step 810, gate oxide layer 436 is deposited on front surface 412 of semiconductor substrate 402 and on the layer 420 on sidewalls and bottom of trench 414.

Step 812 includes depositing a gate electrode layer on the gate oxide layer 436 on the semiconductor substrate and in the one or more trenches to form a transfer gate with vertical transfer gate structure. In an example of step 812, gate electrode layer is a polysilicon material that forms transfer gate 424, which includes planar gate 422 and vertical transfer gate (VTG) 426.

Step 814 includes forming transfer gate spacers on the sidewalls of the transfer gate. In an example of step 814, transfer gate spacers 438 are formed by depositing a dielectric on the surface of substrate 402 then etching to form transfer gate spacers 438 on the sidewalls of planar gate 422.

Step 816 includes implanting impurities in the semiconductor substrate to form a floating diffusion region adjacent to the buried channel implant. In an example of step 816, floating diffusion region 406 having the second conductive type is formed in the semiconductor substrate 402. In embodiments, floating diffusion region 406 is coupled to photodiode 404 through buried channel implant 408 to receive excess electrons from photodiode 404 when the transfer gate is turned off during an integration period of the pixel.

Combinations of Features

Features described above as well as those claimed below may be combined in various ways without departing from the scope hereof. The following enumerated examples illustrate some possible, non-limiting combinations:

(A1) A pixel of an image sensor includes a semiconductor substrate having a front surface and a back surface opposing the front surface; a photodiode in the semiconductor substrate; a floating diffusion (FD) region formed in the semiconductor substrate and separated from the photodiode along a first pixel axis parallel to the front surface; and a transfer gate formed in the front surface of the semiconductor substrate to couple the photodiode to the FD region, the transfer gate including a planar gate on the front surface of the semiconductor substrate; a first vertical transfer gate extending a depth into the semiconductor substrate from the planar gate and located between the photodiode and the FD region along the first pixel axis, the first vertical transfer gate further including a first trench; and a layer of doped semiconductor material epitaxially grown on the sides and bottom of the first trench; wherein the semiconductor substrate and the epitaxially grown doped semiconductor material layer comprise a first conductive type, and the photodiode and the FD region comprise a second conductive type opposite to the first conductive type.

(A2) In pixel (A1), the transfer gate further includes a second vertical transfer gate comprising a second trench having the layer of doped semiconductor material epitaxially grown therein adjacent to the first trench, the first and second trenches located in a plane that is perpendicular to the front surface along a second pixel axis that is perpendicular to the first pixel axis; a gate oxide layer in the first and second trenches on the layer of doped semiconductor material and on the front surface of the semiconductor substrate; and a gate electrode layer in the first and second trenches on the gate oxide layer forming the first and second vertical transfer gates and the planar gate on the front surface along the second pixel axis above the first and second trenches.

(A3) In pixel (A1) or (A2), a buried channel implant of the second conductive type formed in the semiconductor substrate between the photodiode and the FD region, wherein the first and second vertical transfer gates are adjacent to the buried channel implant.

(A4) In pixel (A3), the buried channel implant is formed in between the first and second vertical transfer gates along the second pixel axis and couples the photodiode to the FD region.

(A5) In pixel (A4), the buried channel has a first width W1 between the first and second vertical transfer gates along the first pixel axis and a second width W2 at other locations along the first pixel axis such that W_2>W_1.

(A6) In any of pixels (A1)-(A5), a width of the layer of doped semiconductor material is between 5 and 30 nm.

(A7) In any of pixels (A1)-(A6), the doping concentration of the layer of doped semiconductor material is between $10^{16}$ and $10^{18}$ cm$^{-3}$.

(A8) In any of pixels (A2)-(A7), a width of the first and second trenches comprise a width along the first pixel axis is between 120 and 150 nm.

(B1) An image sensor includes a semiconductor substrate having a front surface and a back surface opposing the front surface; a plurality of photodiodes formed in the semiconductor substrate; a floating diffusion (FD) region formed in the semiconductor substrate adjacent to the plurality of photodiodes, the floating diffusion region separated from each photodiode along a respective first pixel axis parallel to the front surface; a plurality of transfer gates corresponding to the plurality of photodiodes formed in the front surface of the semiconductor substrate to couple each respective photodiode to the FD region, each of the transfer gates formed along a respective second pixel axis parallel to the front surface and perpendicular to the first pixel axis of the corresponding photodiode, each transfer gate including a planar gate on the front surface of the semiconductor substrate; a first vertical transfer gate extending a depth into the semiconductor substrate from the planar gate and located between the photodiode and the FD region along the first pixel axis, the first vertical transfer gate further including a first trench; and a layer of doped semiconductor material epitaxially grown on the sides and bottom of the first trench; wherein the semiconductor substrate and the layer of doped semiconductor material comprise a first conductive type, and each of the photodiode and the FD region comprises a second conductive type opposite to the first conductive type.

(B2) In image sensor (B1), each of the plurality of transfer gates further including a second trench having the layer of doped semiconductor material epitaxially grown therein adjacent to the first trench, the first and second trenches located in a plane that is perpendicular to the front surface along a second pixel axis that is perpendicular to the first pixel axis, the transfer gate further including a gate oxide layer in the first and second trenches on the layer of doped semiconductor material and on a front surface of the semiconductor substrate; and a gate electrode layer in the first and second trenches on the gate oxide layer forming a first and a second vertical transfer gate and the planar gate on the front surface along the second pixel axis above the first and second trenches.

(B3) In image sensor (B2), a plurality of buried channel implants of the second conductive type formed in the semiconductor substrate and coupling the plurality of photodiodes to the FD region, wherein the first and second vertical transfer gates of the plurality of transfer gates are adjacent to each respective buried channel implant.

(B4) In image sensor (B3), each of the plurality of buried channel implants comprises a first width W1 between the respective first and second trenches along the first pixel axis and a second width W2 at other locations along the first pixel axis such that W_2>W_1.

(B5) In either of image sensors (B3) or (B4), a concentration of impurities in the plurality of buried channel implants is greater than a concentration of impurities in the semiconductor substrate and less than a concentration of impurities of the floating diffusion region.

(B6) In any of image sensors (B1)-(B5), four photodiodes adjacent to the FD region, wherein the first pixel axis of first and third photodiodes are aligned, and the first pixel axis of second and fourth photodiodes are aligned.

(C1) A method of forming at least a vertical transfer gate in a semiconductor substrate having a first conductive type and comprising a photodiode and a floating diffusion (FD) region along a first pixel axis, the photodiode and the FD region having a second conductive type, the method includes etching a first trench into a front surface of the semiconductor substrate, the first trench located in a plane that is perpendicular to the front surface along a second pixel axis and between the photodiode and the FD region along the first pixel axis; epitaxially growing a layer of doped semiconductor material on the sides and bottom of the first trench defining a gate length for the vertical transfer gate along the first pixel axis, the layer of doped semiconductor material having the first conductive type.

(C2) In the method of (C1), epitaxially growing the layer of doped semiconductor material is performed at a temperature of approximately 500-650° C.

(C3) In the method of (C1) or (C2), epitaxially growing the layer of doped semiconductor material comprises growing the layer to a width WE of approximately 5-30 nm.

(C4) In any of the methods of (C1)-(C3), etching the one or more trenches further comprises etching the trenches to a width along the first pixel axis of approximately 120-150 nm.

(C5) In any of the methods of (C1)-(C4), etching a second trench into the front surface of the semiconductor substrate wherein the second trench is adjacent to the first trench during etching of the first trench, the first and second trenches located in a plane that is perpendicular to the front surface along a second pixel axis that is perpendicular to the first pixel axis; epitaxially growing the layer of doped semiconductor material on the sides and bottom of the second trench; depositing a gate oxide layer in the first and second trenches on the layer of doped semiconductor material and on a front surface of the semiconductor substrate; and depositing a gate electrode layer in the first and second trenches on the gate oxide layer forming a first and a second vertical transfer gate and a planar gate on the front surface along the second pixel axis above the first and second trenches.

(C6) In the method of (C5), prior to etching a first trench and a second trench, implanting impurities of the second conductive type into the semiconductor substrate to form a buried channel implant between the photodiode and the floating diffusion region along the first pixel axis.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

The invention claimed is:

1. A pixel of an image sensor comprising:
a semiconductor substrate having a front surface and a back surface opposing the front surface;
a photodiode in the semiconductor substrate;
a floating diffusion (FD) region formed in the semiconductor substrate and separated from the photodiode along a first pixel axis parallel to the front surface; and
a transfer gate formed in the front surface of the semiconductor substrate to couple the photodiode to the FD region, the transfer gate comprising:
a planar gate on the front surface of the semiconductor substrate;
a first vertical transfer gate extending a depth into the semiconductor substrate from the planar gate and located between the photodiode and the FD region along the first pixel axis, the first vertical transfer gate further comprising:
a first trench; and
a first layer of doped semiconductor material epitaxially grown on the sides and bottom of the first trench; and
a second vertical transfer gate extending a depth into the semiconductor substrate from the planar gate and located between the photodiode and the FD region along the first pixel axis, the second vertical transfer gate further comprising:
a second trench; and
a second layer of doped semiconductor material epitaxially grown on the sides and bottom therein adjacent to the first trench, the first and second trenches located in a plane that is perpendicular to the front surface along a second pixel axis that is perpendicular to the first pixel axis; and
a buried channel implant formed in the semiconductor substrate between the photodiode and the FD region, wherein the buried channel has a first width $W_1$ between the first and second vertical transfer gates along the first pixel axis and a second width $W_2$ at other locations along the first pixel axis such that $W_2 > W_1$;
wherein the semiconductor substrate and the epitaxially grown doped semiconductor material layer comprise a first conductive type, and the photodiode, the FD region, and the buried channel implant comprise a second conductive type opposite to the first conductive type.

2. The pixel of claim 1, the transfer gate further comprising:
a gate oxide layer in the first and second trenches on the first and second layers of doped semiconductor material and on the front surface of the semiconductor substrate; and
a gate electrode layer in the first and second trenches on the gate oxide layer forming the first and second vertical transfer gates and the planar gate on the front surface along the second pixel axis above the first and second trenches.

3. The pixel of claim 1, wherein the buried channel implant is formed in between the first and second vertical transfer gates along the second pixel axis and couples the photodiode to the FD region.

4. The pixel of claim 1, wherein a width of the first and second layers of doped semiconductor material is between 5 and 30 nm.

5. The pixel of claim 1, wherein a doping concentration of the first and second layers of doped semiconductor material is between $10^{16}$ and $10^{18}$ cm$^{-3}$.

6. The pixel of claim 1, wherein a width of the first and second trenches comprise a width along the first pixel axis is between 120 and 150 nm.

7. An image sensor comprising
a semiconductor substrate having a front surface and a back surface opposing the front surface;
a plurality of photodiodes formed in the semiconductor substrate;
a floating diffusion (FD) region formed in the semiconductor substrate adjacent to the plurality of photodiodes, the floating diffusion region separated from each photodiode along a respective first pixel axis parallel to the front surface;
a plurality of transfer gates corresponding to the plurality of photodiodes formed in the front surface of the semiconductor substrate to couple each respective photodiode to the FD region, each of the transfer gates formed along a respective second pixel axis parallel to the front surface and perpendicular to the first pixel axis of the corresponding photodiode, each transfer gate comprising:
a planar gate on the front surface of the semiconductor substrate;
a first vertical transfer gate extending a depth into the semiconductor substrate from the planar gate and located between the photodiode and the FD region along the first pixel axis, the first vertical transfer gate further comprising:
a first trench; and
a layer of doped semiconductor material epitaxially grown on the sides and bottom of the first trench; and
a second vertical transfer gate extending a depth into the semiconductor substrate from the planar gate and located between the photodiode and the FD region along the first pixel axis, the second vertical transfer gate further comprising:
a second trench; and
a second layer of doped semiconductor material epitaxially grown on the sides and bottom therein adjacent to the first trench, the first and second trenches located in a plane that is perpendicular to the front surface along a second pixel axis that is perpendicular to the first pixel axis; and
a plurality of buried channel implants formed in the semiconductor substrate between the plurality of photodiodes and the plurality of FD regions, wherein each of the buried channel implants has a first width $W_1$ between the first and second trenches along the first pixel axis and a second width $W_2$ at other locations along the first pixel axis such that $W_2 > W_1$;
wherein the semiconductor substrate and the layer of doped semiconductor material comprise a first conductive type, and each of the photodiode, the FD region, and the buried channel implant comprises a second conductive type opposite to the first conductive type.

8. The image sensor of claim 7, the transfer gate further comprising:
a gate oxide layer in the first and second trenches on the first and second layers of doped semiconductor material and on a front surface of the semiconductor substrate; and
a gate electrode layer in the first and second trenches on the gate oxide layer forming a first and a second vertical transfer gate and the planar gate on the front surface along the second pixel axis above the first and second trenches.

9. The image sensor of claim 7, wherein a concentration of impurities in the plurality of buried channel implants is greater than a concentration of impurities in the semiconductor substrate and less than a concentration of impurities of the floating diffusion region.

10. The image sensor of claim 7, further comprising four photodiodes adjacent to the FD region, wherein the first pixel axis of first and third photodiodes are aligned, and the first pixel axis of second and fourth photodiodes are aligned.

* * * * *